(12) United States Patent
Zeng et al.

(10) Patent No.: US 11,275,353 B2
(45) Date of Patent: *Mar. 15, 2022

(54) CREATING A VOXEL REPRESENTATION OF A THREE DIMENSIONAL (3-D) OBJECT

(71) Applicant: HEWLETT-PACKARD DEVELOPMENT COMPANY, L.P., Spring, TX (US)

(72) Inventors: Jun Zeng, Palo Alto, CA (US); Sebastia Cortes, Sant Cugat del Valles (ES); Scott A. White, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/862,967

(22) Filed: Apr. 30, 2020

(65) Prior Publication Data
US 2020/0257268 A1 Aug. 13, 2020

Related U.S. Application Data

(63) Continuation of application No. 15/544,956, filed as application No. PCT/US2015/026658 on Apr. 20, 2015, now Pat. No. 10,678,217.

(51) Int. Cl.
*G05B 19/4099* (2006.01)
*G06T 19/20* (2011.01)
(Continued)

(52) U.S. Cl.
CPC .......... *G05B 19/4099* (2013.01); *B33Y 50/00* (2014.12); *G06F 30/20* (2020.01);
(Continued)

(58) Field of Classification Search
CPC ...... G05B 19/4099; G05B 2219/49007; G06F 30/20; G06T 19/20; G06T 17/00;
(Continued)

(56) References Cited

U.S. PATENT DOCUMENTS 248,265 A 10/1881 Wickham
8,509,933 B2 8/2013 Steingart et al.
(Continued)

FOREIGN PATENT DOCUMENTS

CN 103617603 A * 3/2014
WO WO-2013072874 A1 5/2013
WO WO-2013113372 8/2013

OTHER PUBLICATIONS

Bickel et al; "Design and Fabrication of Materials with Desired Deformation Behavior"; ACM Transactions on Graphics; vol. 29, No. 4; Jul. 26, 2010.
(Continued)

*Primary Examiner* — Thomas C Lee
*Assistant Examiner* — Michael Tang
(74) *Attorney, Agent, or Firm* — Fabian VanCott

(57) ABSTRACT

An example technique for creating a voxel representation of a three dimensional (3-D) object can include obtaining a shape specification of a 3-D object and a number of 3-D objectives. The example technique for creating a voxel representation of the 3-D object can also include creating a voxel representation of the 3-D object by assigning a material type from a number of material types to each voxel of the voxel representation that defines the 3-D object. The example technique creating a voxel representation of a 3-D object can also include evaluating the voxel representation to determine whether the number of objectives are met.

20 Claims, 6 Drawing Sheets

(51) Int. Cl.
*G06T 17/00* (2006.01)
*B33Y 50/00* (2015.01)
*G06F 30/20* (2020.01)
*G06T 15/08* (2011.01)

(52) U.S. Cl.
CPC .............. *G06T 15/08* (2013.01); *G06T 17/00* (2013.01); *G06T 17/005* (2013.01); *G06T 19/20* (2013.01); *G05B 2219/49007* (2013.01); *G06T 2210/52* (2013.01); *G06T 2219/2012* (2013.01); *G06T 2219/2021* (2013.01)

(58) Field of Classification Search
CPC .................. G06T 15/08; G06T 17/005; G06T 2219/2012; G06T 2219/2021; G06T 2210/52; B33Y 50/00
See application file for complete search history.

(56) References Cited

U.S. PATENT DOCUMENTS

| | | | |
|---|---|---|---|
| 9,600,929 B1* | 3/2017 | Young | G06T 1/60 |
| 2004/0249809 A1* | 12/2004 | Ramani | G06K 9/6892 |
| 2007/0248265 A1 | 10/2007 | Lundstrom | |
| 2011/0222081 A1 | 9/2011 | Yi et al. | |
| 2011/0276159 A1 | 11/2011 | Chun | |
| 2011/0282482 A1 | 11/2011 | Knighton | |
| 2012/0053716 A1* | 3/2012 | Bickel | G06F 30/00 |
| | | | 700/98 |
| 2012/0065755 A1* | 3/2012 | Steingart | B33Y 30/00 |
| | | | 700/98 |
| 2012/0158369 A1 | 6/2012 | Bachrach et al. | |
| 2013/0124151 A1 | 5/2013 | Mech | |
| 2013/0197878 A1* | 8/2013 | Fiege | G06F 30/20 |
| | | | 703/2 |
| 2014/0031967 A1 | 1/2014 | Unger et al. | |
| 2014/0052415 A1 | 2/2014 | Baran | |
| 2014/0312535 A1* | 10/2014 | Dikovsky | A61F 2/30942 |
| | | | 264/401 |
| 2014/0324204 A1* | 10/2014 | Vidimce | B29C 64/386 |
| | | | 700/98 |
| 2015/0066440 A1* | 3/2015 | Chen | G06F 30/00 |
| | | | 703/1 |
| 2015/0351467 A1 | 12/2015 | Simoes | |
| 2016/0209819 A1* | 7/2016 | Cudak | G05B 19/41865 |
| 2016/0236416 A1* | 8/2016 | Bheda | B33Y 50/02 |
| 2018/0079138 A1* | 3/2018 | Tanaka | B29C 64/386 |
| 2018/0297266 A1 | 10/2018 | Linnell | |
| 2018/0319083 A1* | 11/2018 | Teken | B29C 64/112 |

OTHER PUBLICATIONS

Barbic, Jernej; "MRI: Acquisition of a Multi-Material 30 Printer"; Viterbi School of Engineering, University of Southern California; Jan. 23, 2014.

Vidimce, et al; "OpenFab: A Programmable Pipeline for Multi-Material Fabrication"; ACM Transactions on Graphics; vol. 32, No. 4, Art. 136; Jul. 1, 2013.

* cited by examiner

CREATING A VOXEL REPRESENTATION OF A THREE DIMENSIONAL (3-D) OBJECT

BACKGROUND

Three dimensional (3-D) printing is a term commonly used to describe processes used to make 3-D objects. In 3-D printing, an additive process may be used to successively layer material to create a 3-D object. The resolution of a printed 3-D object may be limited by the resolution of a 3-D printer used to print the 3-D object.

DETAILED DESCRIPTION

Creating a voxel representation of a three dimensional (3-D) object can include obtaining a shape specification of a 3-D object and a number of objectives for the 3-D object. As used herein, a 3-D object is an object that can be represented along an x-axis, a y-axis, and a z-axis. A shape specification defines a shape (e.g., geometry) of a 3-D object. Such shape specification can be a specification of geometrical parameters and/or coordinates. The shape specification can also be an acceptable range of geometrical parameters and/or coordinates. Creating a voxel representation of a 3-D object can include creating a voxel representation of the 3-D object by assigning a material type from a number of material types to each voxel of the voxel representation that defines the 3-D object. Creating a voxel representation of a 3-D object can include evaluating the voxel representation to determine whether the number of objectives are met.

In a number of other approaches, a voxel is a volumetric entity on a 3-D grid that is the most-basic building block for a 3-D object. Therefore, the resolution of any shape and/or material change can reach at most voxel level without dividing the voxels which results in additional demands for computing resources (e.g., processing resource and/or memory resource) as compared to not dividing the voxels. Details smaller than a voxel may be discarded. This may be undesirable in contrast to other approaches representing a 3-D object using a boundary mesh where the sharp features (e.g., corners) are preserved.

In contrast, in a number of examples of the present disclosure each voxel is associated with a plurality of data types and/or material types to encode features of the 3-D object. The data types in association with the voxel can be used to decode features of the 3-D object that have a higher resolution than a given voxel. The material types can define a material that is associated with a voxel. In a number of examples, the material types are material types (e.g., coalescence modifier, detailing agent and/or build material) that are loaded in a 3-D printer used to print the 3-D object using the voxel representation of the 3-D object, and/or material types that are compatible with the 3-D printer.

Figure 1:
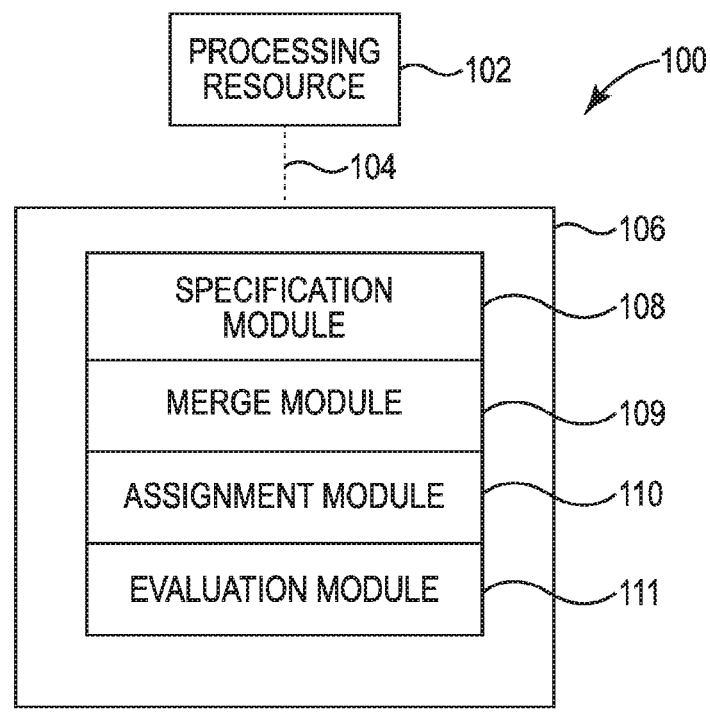
FIG. 1 illustrates a block diagram of an example of a computing device according to the present disclosure.

FIG. 1 illustrates a block diagram of an example of a computing device according to the present disclosure. The computing device 100 can include a processing resource 102 connected 104 to a memory resource 106, (e.g., a computer-readable medium (CRM), machine readable medium (MRM), database, etc.). The memory resource 106 can include a number of computing modules. The example of FIG. 1 shows a specification module 108, a merge module 109, an assignment module 110, and/or an evaluation module 111. As used herein, a computing module can include program code (e.g., computer executable instructions, hardware, firmware, and/or logic) but includes at least instructions executable by the processing resource 102 (e.g., in the form of modules, to perform particular actions, tasks, and functions described in more detail herein in reference to FIGS. 3-7).

The specification module 108, as used herein and as will be explained in more detail in connection with FIG. 3, can include instructions that are executed by the processing resource 102 to create and/or receive a number of shape specifications and/or a number of material specifications. The shape specifications can describe the shape (e.g., geometry) of the 3-D object. For example, a single shape specification can describe the 3-D object or each of a plurality of shape specifications can describe a plurality of portions of the 3-D object.

A material specification defines a material(s) and/or material property (e.g., elasticity, strength, and/or color, among other material properties) that form the 3-D object. In a number of examples, the dimensions of the material specification can be the dimensions of the shape specification or the dimensions of the material specification can be different than the dimensions of the shape specification. The material specification can be defined by a plurality of material property values.

A merge module 109 can include instructions that are executed by the processing resource 102 to merge the number of shape specifications with the number of material specifications. The shape specifications and the material specifications can be merged to create a single model of the 3-D object. The single model of the 3-D object can be defined by a grid (e.g., a 3-D grid) of voxels. A voxel can be a volume associated with the 3-D space. The voxel can be associated with a number of data types and/or material types that can define features of the 3-D object at a higher resolution that that provided by the grid of voxels. The position of a voxel can be inferred based upon its position relative to other voxels. The grid of voxels that is created from the merging of the shape specification 330 and the material specification 332 is an example of a model of the 3-D object. FIG. 3 further describes the result of merging the shape specification with the material specification.

An assignment module 110 can include instructions that are executed by the processing resource 102 to assign a material type from a number of materials types to each voxel of the voxel representation of the 3-D object. The material types can be defined by a 3-D printer. For example, a 3-D printer can provide the assignment module 110 a number of material types that define a number of printing materials used by the 3-D printer. In a number of examples, the assignment module 110 can assign material types to voxels regardless of whether a material specification was obtained or whether a material specification was not obtained.

An evaluation module 111 can include instructions that are executed by the processing resource 102 to evaluate the voxel representation after the voxels have been assigned a material type to determine whether the number of objectives and/or the number of criteria are met. Evaluating the voxel representation can include evaluating the 3-D object represented in the voxel representation. Evaluating the 3-D object can include evaluating a number of components (e.g., parts) of the 3-D object to determine whether the components meet at least one of the number of objectives and/or the number of criteria.

The criteria can include shape requirements. A shape requirement can describe how different parts interact within the 3-D object. The criteria can include mechanical strength requirements, for instance. An example of mechanical strength requirements includes stress requirements, tension requirements, compression requirements, and/or temperature requirements. A temperature requirement can define a low and/or high temperature that a 3-D object can bear without a shape change and/or without a shape change within a predefined variance. A shape change can include an expansion of the shape of the 3-D object and/or a shrinkage of the shape of a 3-D object.

Objectives can include weight objectives, cost objectives, and/or production cost objectives. A weight objective can request that a 3-D object be as light as possible. A cost objective can request that the cost of production of the 3-D object be as low as possible. A production time objective can request that the time of production be as low as possible.

The assignment module 110 can re-assign material types to voxels in the voxel representation of the 3-D object, when the evaluation determines that the number of objectives and/or the number of criteria are not met. The voxel representation of the 3-D object can be complete when the number of objectives and/or the number of criteria are met and/or a predefined quantity of the number of objectives and/or the number of criteria are met. For example, the voxel representation of the 3-D objective can be complete when there is no more improvement in meeting the number of objectives and/or the number of criteria. The voxel representation of the 3-D objective can also be complete when the computational cost associated with meeting the objectives and/or the number of criteria is greater than a predefined threshold.

A number of features associated with the 3-D object can be encoded within each of the grid of voxels. The sub-voxels features are encoded by storing data (e.g., data types and/or material types) within a voxel.

In a number of examples, the voxel representation of the 3-D object can be sliced into slice data. Slice data is data derived from the model of the 3-D object that can be provided to and used by the 3-D printer to print the 3-D object. The slice data is further described in FIG. 3.

Features of the 3-D object that have a higher resolution than the resolution provided by the grid of voxels from a given voxel can be decoded. Features with a higher resolution than the resolution provided by any voxel from the grid of voxels can be decoded to print a 3-D object with a higher resolution than the resolution provided by the grid of voxels.

The number of modules shown in FIG. 1 (e.g., specification module 108, merge module 109, assignment module 110, and evaluation module 111) can be combined with other modules or be sub-modules of other modules. The modules can be stored in a memory resource 106 as shown in FIG. 1 and/or be contained within the same computing device. In another example, the number of modules (e.g., specification module 108, merge module 109, assignment module 110, and evaluation module 111) can comprise individual modules at separate and distinct locations on different memory resources (e.g., CRM, etc.) such as in a distributed computing environment (e.g., cloud computing environment). Further, the processing resource 102 executing instructions associated with a particular module (e.g., specification module 108, merge module 109, assignment module 110, and evaluation module 111) can function as an engine, such as the example engines shown in FIG. 2. As used herein, the number of modules and/or the number of engines can include more or less engines/modules than those shown.

Figure 2:
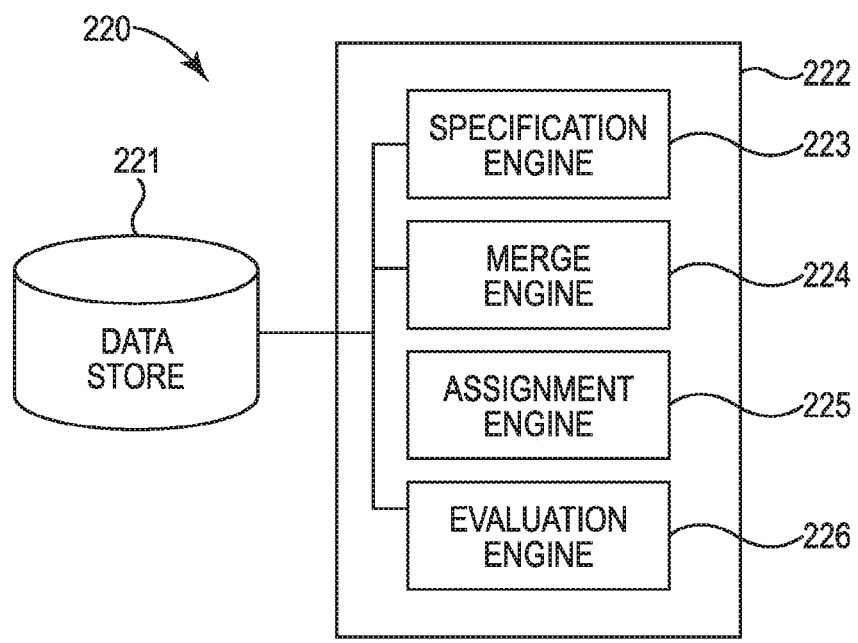
FIG. 2 illustrates a block diagram of an example of a system to create a voxel representation of a three dimensional (3-D) object according to the present disclosure.

FIG. 2 illustrates a block diagram of an example of a system to generate slice data from a voxel representation according to the present disclosure. The system 220 can perform a number of functions and operations as described in FIG. 3 (e.g., generating data to drive a 3-D printer). The system 220 can include a data store 221 connected to a user defined function system 222. In this example, the user defined function system 222 can include a number of computing engines. The example of FIG. 2 shows a specification engine 223, a merge engine 224, an assignment engine 225, and an evaluation engine 226. As used herein, a computing engine can include hardware firmware, logic, and/or executable instructions, but includes at least hardware (e.g., a processor, transistor logic, application specific integrated circuit (ASIC), etc.) executing instructions to perform particular actions, tasks and functions described in more detail herein in reference to FIG. 3.

In the example of FIG. 2, the specification engine 223 can include hardware and/or a combination of hardware and programming (e.g., executable instructions), but at least hardware, to create, receive, and/or define a number of specifications of a 3-D object, a number of objectives, and a number of criteria.

A merge engine 224 can include hardware and/or a combination of hardware and programming, but at least hardware, to merge the specifications of the 3-D object to create a voxel representation of the 3-D object. An assignment engine 225 can include hardware and/or a combination of hardware and programming, but at least hardware, to divide the 3-D object represented in the voxel representation into a shell portion and an interior portion of the 3-D object. An assignment engine 225 can include hardware and/or a combination of hardware and programming, but at least hardware, to assign a material type to each voxel in the voxel representation.

An evaluation engine 226 can include hardware and/or a combination of hardware and programming, but at least hardware, to evaluate the voxel representation each time the material type is assigned to a voxel in the voxel representation to determine whether the number of objectives and/or criteria are met. The 3-D object can be divided into the shell portion and the interior portion to meet the number of objectives and/or criteria. The interior portion can be assigned a material type of VOID. That is, a portion of the voxels associated with the interior portion can be assigned a VOID material type and/or any of the other material types depending on the objectives and/or criteria. Assigning voxels in the interior portion of a 3-D object a VOID material type can result in hollow interior structure and/or a completely hollow interior portion of the 3-D object. The material type assigned to a voxel of the voxel representation can be compatible with a material defined in the material specification that is associated with the voxel.

The assignment engine 225 can also include hardware and/or a combination of hardware and programming, but at least hardware, to re-assign material types to voxels in the voxel representation when the number of conditions are determined not to be met in the evaluation engine 226. The material types can be re-assigned based upon a learning module such as a genetic learning module to try to guide an assignment of the material types towards a state that meets the conditions and/or criteria of the 3-D objective defined in the voxel representation. The material types can also be re-assigned based upon other evolutionary learning modules (e.g. simulated annealing learning module and/or swarm learning module).

The specification engine 223, the merge engine 224, the assignment engine 225, and the evaluation engine 226 shown in FIG. 2 and/or the specification module 108, the merge module 109, the assignment module 110, and the evaluation module 111 in FIG. 1 can be sub-engines/modules of other engines/modules and/or combined to perform particular actions, tasks, and functions within a particular system and/or computing device. Further, the engines and/or modules described in connection with FIGS. 1 and 2 can be located in a single system and/or computing device or reside in separate distinct locations in a distributed computing environment, (e.g., cloud computing environment). Examples are not limited to these examples.

Figure 3:
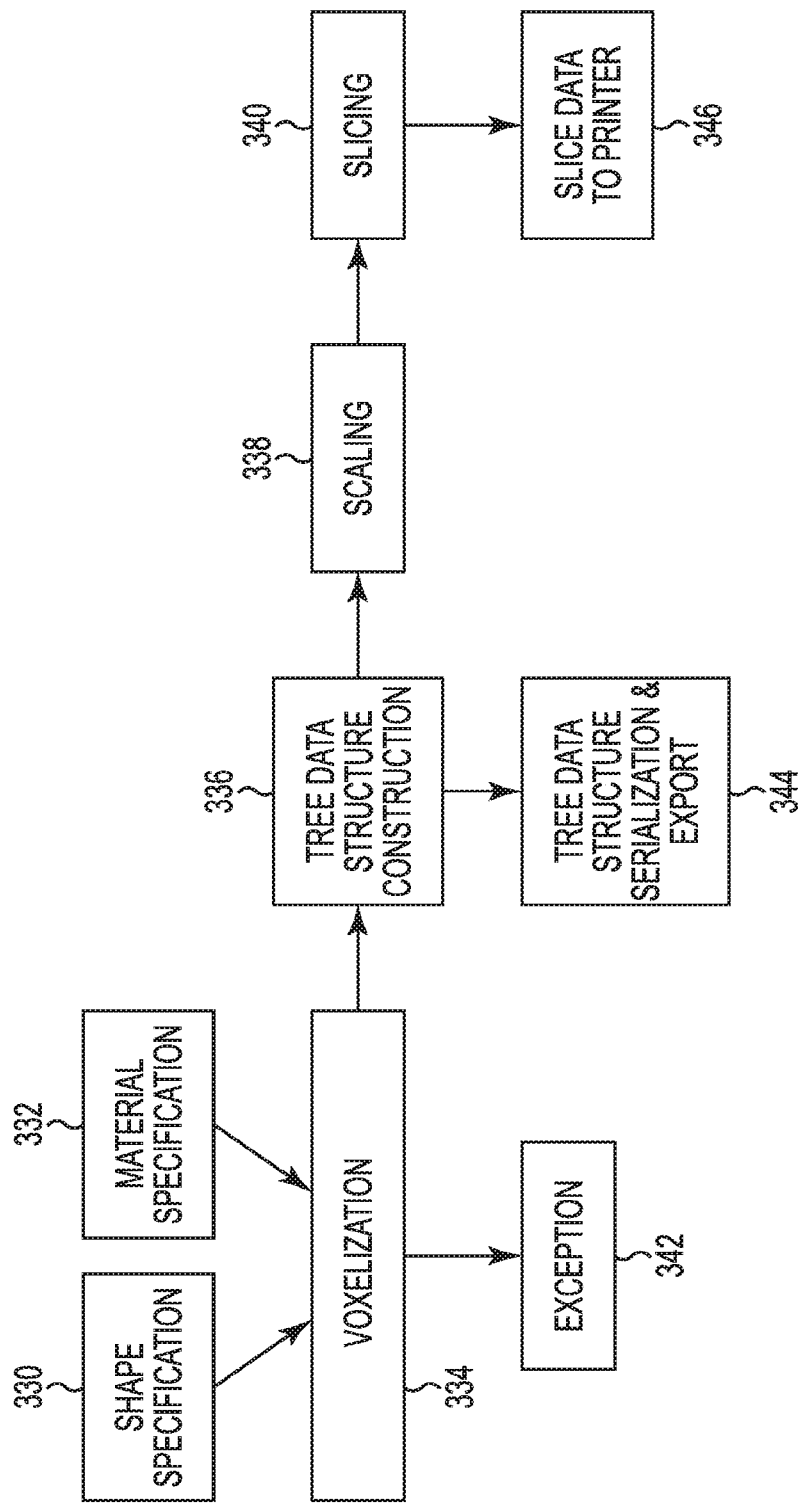
FIG. 3 illustrates a block diagram of an example of generating slice data according to the present disclosure.
Figure 4:
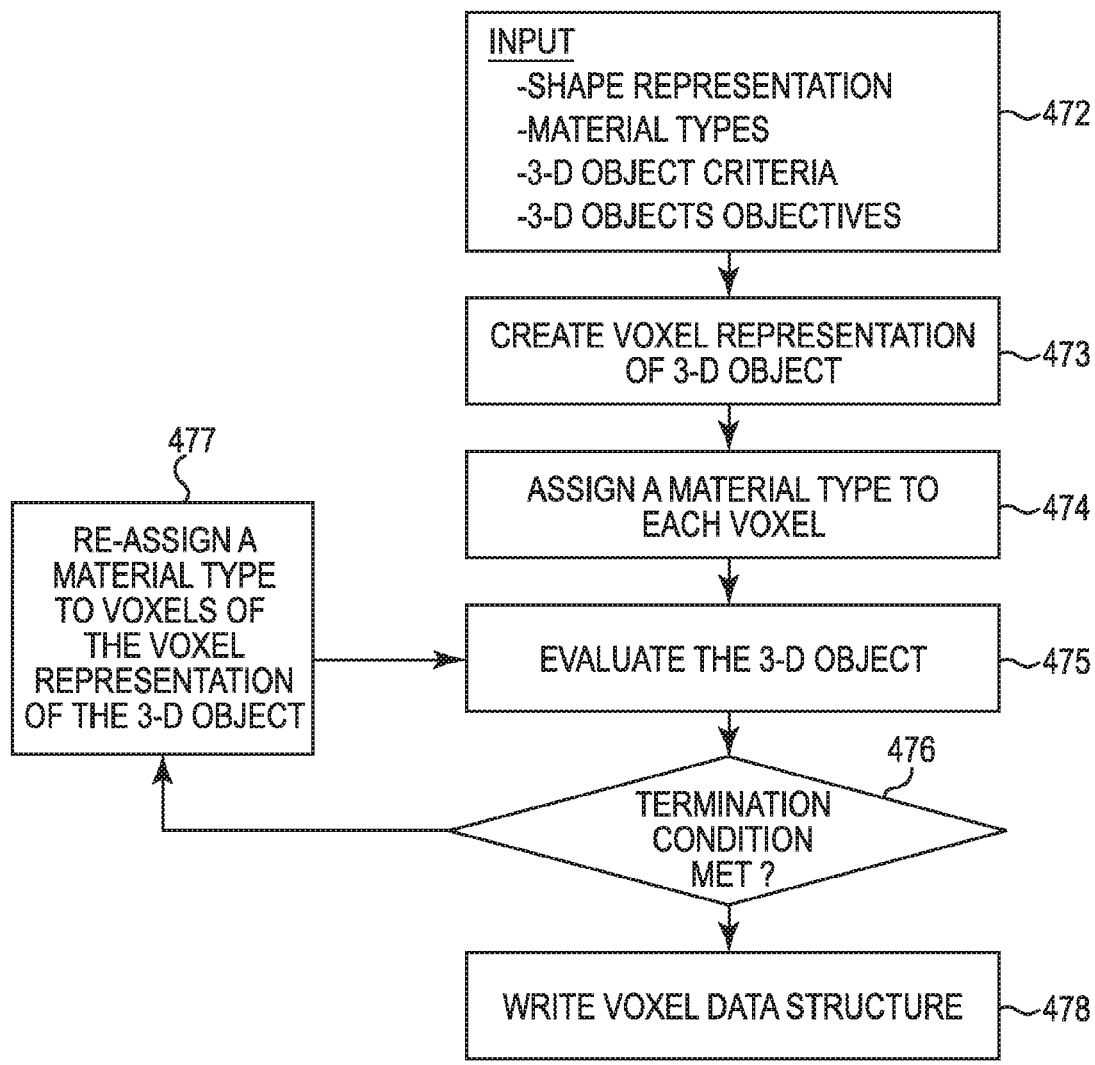
FIG. 4 illustrates a block diagram of an example of creating a voxel representation of a 3-D object according to the present disclosure.

FIG. 3 illustrates a block diagram of an example of generating slice data according to the present disclosure. FIG. 3 illustrates a shape specification 330, a material specification 332, a voxelization 334 of the shape specification 330 and the material specification 332 to merge the shape specification 330 with the material specification 332 to create voxel representation (e.g., model) of the 3-D object. FIG. 4 describes the creation of the voxel representation of the 3-D object. FIG. 3 also illustrates an exception 342, the construction of a tree data structure 336, the serialization export 344 of the tree data structure, the scaling 338 of the tree data structure, the slicing 340 of the tree data structure, and providing the slice data to the 3-D printer (e.g., printer) 346.

As used herein, creating the shape specification 330 and the material specification 332, merging the shape specification 330 and the material specification 332, creating a voxel representation of the shape specification 330 and the material specification 332, constructing a tree data structure 336, scaling 338 the tree data structure, and/or slicing 340 the data associated with the tree data structure can be part of a design process. The design process can be independent of a printing process which includes providing slice data to printer 346 and/or printing the slice data. For example, the design process can occur outside of a 3-D printer and/or a processing resource associated with the printer. The design process can also be part of the printing process. For example, the design process can be executed in a 3-D printer and/or in a processing resource associated with a 3-D printer.

The shape specification 330 can be a 3-D model that defines the shape of 3-D object. The shape specification 330 can define both the internal and the external portion of the 3-D object. The shape specification 330 can be a number of shape specifications 330. The number of shape specifications 330 can collectively define the 3-D object. For example, each of the number of shape specifications 330 can define a different portion of the 3-D object. Each of the different portions of the 3-D object can define a different part of the 3-D object.

The shape specification 330 can be defined using polygon meshes. For example, the shape specification 330 can be defined using a number of formats such as a stereolithography (STL) file format, an OBJ file format, and/or an X3D file format among other type of files formats.

A material specification 332 is a 3-D distribution of material types and/or material properties of a 3-D object. As used herein, the terms material type and material are used interchangeably. A material property can be an attribute of a material type. For example, a material type can be a color that is used by a 3-D printer, while a material property can be red, greed, blue (RGB) values. The material specification 332 can be a number of material specifications 332. For example, a first material specification 332 can define a first material type while a second material specification 332 can define a second material type, the first material type and the second material type comprising the materials (e.g., different materials) in a 3-D object. However, the number of material specifications 332 can comprise more than two material specifications.

The material specifications 332 can also define a number of material properties associated with a material type and/or a plurality of material types that comprise the 3-D object. For example, a first material specification 332 can define a density of a particular material and a second material specification 332 can define a color of the particular material when a density and a color of a material type are material properties associated with a material type.

The material specification 332 can provide a description of material heterogeneity both inside a 3-D object and on the part surface of the 3-D object. The material specification 332 can describe a number of interactions between different material types and/or property types. For example the material specification 332 can describe discrete multi-material interactions, functionally graded multi-material interactions, and digitally engineered multi-material interactions.

A material (types or properties) distribution is specified independently of the shape specifications (e.g., vertices, elements, patches). A material specification can be a three dimensional mathematical function that describes a distribution of a material attribute (e.g., planar shapes) with continuous variation of a material quantity (e.g., thermal conductivity, a concentric shape, wavelets, etc.). A distribution can also describe desired variations (discrete or continuous) in a 3-D space that enable the use of arbitrary material distribution patterns including both that of continuous (e.g., a concentric pattern) and that of discrete (e.g., a binary planar pattern). A distribution can be described via mathematical expressions or mappings from other digitized sources (e.g., images). A distribution can also be described by assigning material types to each of the voxels.

The shape specification 330 and the material specification 332 are independent of each other. That is, the shape specification 330 and the material specification 332 may not conform to each other. For example, a shape specification 330 can define the shape of a 3-D object while a material specification 332 can define a material inside and/or outside the bounds of the shape of the 3-D object defined in the shape specification 332. However, such independence does not exclude the shape specification 330 from being part of the material specification 332 or the material specification 332 from being part of the shape specification 330. That is, such independence does not exclude the shape specification 330 and the material specification 332 from being saved in a same file.

In a number of examples, the shape specification 330 and the material specification 332 can be geometrically scaled before the shape specification 330 and the material specification 332 are merged and/or before the shape specification 330 is subject to voxelization 334. A shape specification 330 can be geometrically scaled to a resolution of the material specification 332. A material specification 332 can be geometrically scaled to a resolution of the shape specification 332. The above geometrical scaling can be anisotropic using scaling vectors. That is, the above geometrical scaling can be directionally dependent.

The voxelization 334 of the shape specification 330 and the material specification 332 can define the merger of the shape specification 330 and the material specification 332. Merging the shape specification 330 and the material specification 332 can also be described as the synthesizing of the shape specification 330 and the material specification 332.

The shape specification 330 and the material specification 332 can be merged by fixing the six-degrees of freedom of one specification with respect to the other specification. For instance, center-of-mass (x, y, and z) can account for three-degrees of freedom while the three rotational angles (roll, yaw, and pitch) can account for an additional three-degrees of freedom. Fixing the center-of mass (x, y, and z) and three rotational angles (roll, yaw, and pitch) can merge the material specification 332 with respect to the shape specification 330 and as a result can bind the material specification 332 and the shape specification 330.

In a number of examples, multiple shape specifications 330 can be merged with one material specification 332 to define a 3-D object. For example, a first shape specification 330 and a second shape specification 330 can be merged with a material specification 332. That is, a material specification 330 can be used to describe a material distribution over multiple portions of a 3-D object. Multiple material specifications 332 can be merged with a shape specification to define the 3-D object. For examples, a first material specification 332 and a second material specification 332 can be merged with a shape specification 330. That is, multiple material specifications 330 can describe different material properties of the 3-D object. Multiple material specifications 332 can be merged with multiple shape specifications 330 to define the 3-D object. For example, a first material specification 332 can be merged with a first shape specification 330 and a second material specification 332 can be merged with a second shape specification 330 which can define the 3-D object. That is, a first portion of a 3-D object can be defined by the first material specification 332 and the first shape specification 330 and a second portion of the 3-D object can be defined by the second material specification 332 and the second shape specification 330. Moreover, a first material specification 332 can define the thermal conductivity of a portion (e.g., a part) of the 3-D object while a second material specification 332 can define the texture of the same portion of the 3-D object.

The merging of the shape specification 330 and the material specification 332 can be performed using a number of processing resources in parallel. A number of processing resources can include a number of CPUs and/or a number of graphical processing units (GPUs), for example.

Merging the shape specification 330 and the material specification 332 can include scan-converting the shape specification 330 described using a boundary mesh into a grid of voxels. In a number of examples, the shape specification 330 can be scan-converted to create the grid of voxels without the merging of a material specification 332. That is, a voxel representation of the 3-D object can be created from the shape specification 330 without the material specification 332.

Figure 5:
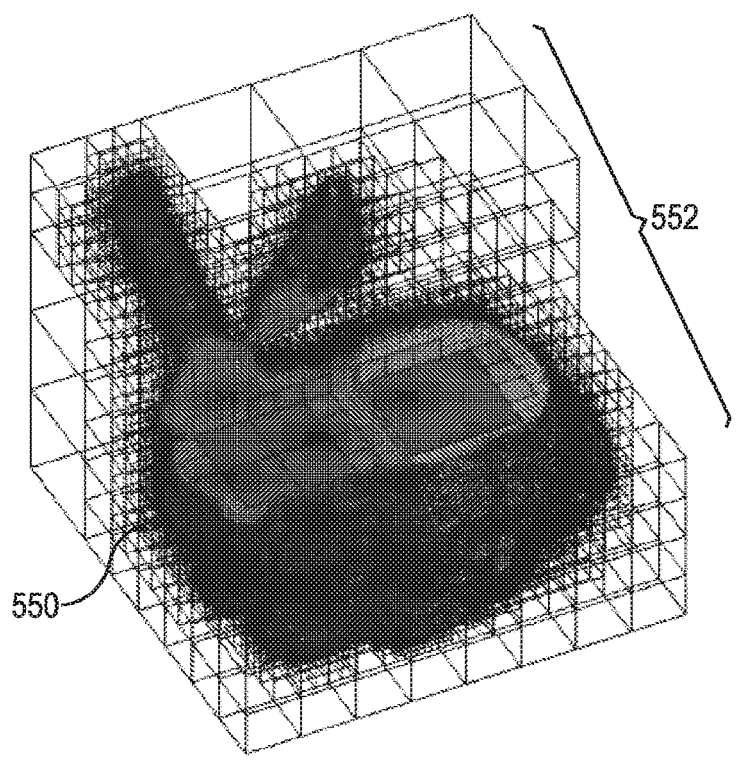
FIG. 5 illustrates an example of a grid of voxels according to the present disclosure.

An example of a grid of voxels is provided in FIG. 5. As used herein, a voxel represents a value on a 3-D space. A voxel can be a volume associated with the 3-D space. The voxel can have a value of solid, VOID (e.g., empty), or a differently defined description of the 3-D space such as a material type. The position of a voxel can be inferred based upon its position relative to other voxels. The grid of voxels that is created from the merging of the shape specification 330 and the material specification 332 can be an example of a voxel representation (e.g., model) of the 3-D object.

In creating the grid of voxels, each of the voxels of the grid of voxels is defined. Defining a voxel can include encoding shape features at a voxel. In a number of examples, the grid of voxels can be encoded with shape features after the grid of voxels are defined. Encoding a shape feature can include storing multiple data types associated with a shape of the 3-D object other than a solid and/or empty value. The multiple data types associated with the voxel can be used to decode (e.g., reconstruct) a number of features from a particular voxel and/or a group of voxels. The number of decoded features can be shape (e.g., geometry) features or material boundaries associated with the 3-D object. The number of data types stored in each of the voxels in the grid of voxels can provide the ability to print a 3-D object with a higher resolution than that provided by the grid of voxels. The number of features decoded from the plurality of voxels from the grid of voxels can provide an increased resolution of the 3-D object. For example, during the assignment of material types multiple material types can be assigned to a voxel. Each material type assigned to a voxel can occupy a fraction of a voxel. The interfaces between different material types in a voxel can be defined by the shape feature data recorded in the voxel.

During the scan-converting of the shape specification 330 it can be determine whether shape specification 330 is watertight (e.g., air-tight). As used herein, watertight is used to describe a model that is suitable for 3-D printing. A watertight model indicates that there are no holes, cracks, or missing features in a model that would render the model unsuitable for 3-D printing. An exception 342 can be raised such that the scan-conversion process will terminate and reference a part of the grid of voxels that should be repaired to proceed with the 3-D printing of the 3-D object when the grid of voxels is not watertight.

The scan-converting can also include transforming the material property values associated with the material specification 332 into different types of materials and/or material properties that make up the 3-D object. That is, the voxelization 334 of the shape specification 330 and the material specification 332 can include mapping voxels with material types and/or material properties described in the material specification 332.

A voxel can be mapped to material types and/or material properties by using a bottom-up parallelized construction to build up a tree data structure 336 while simultaneously evaluating the material types for each node in the tree data structure.

A bottom-up parallelized construction can include traversing the grid of voxels. For example, a plurality of leaf nodes can be associated with the grid of voxels. The leaf nodes (e.g., level i) can be traverses upstream (e.g., from a leaf node to a rood node) to find non-leaf nodes at their parent level (e.g., level i-1). A node array can be created to hold nodes leaf nodes. The quantity of leaf nodes can be eight times the quantity of non-leaf nodes in level i-1. The nodes at each level (e.g., level i-2 . . . , level i-Q) in a tree structure can be added to the node array until the root node is reached.

The node array can be created in parallel. That is, different paths in the tree structure can be traversed in parallel to add nodes to the node array. After creating the node array, the materials associated with the leaf nodes can be defined based on the material specification 332. A hierarchical propagation can be used to identify the intersection voxels, which signify the change of material properties, and fill in material information (e.g., the material types in a given voxel) into voxels between intersection voxels. The filling process is specified along an x-axis. However, the filling process can be along any pre-defined axis.

In a number of examples, a tree data structure suitable for mapping a grid of voxels with materials and/or material properties can be an octree. The octree can store the results of the voxelization 334 of the shape specification 330 and the material specification 332.

Each voxel in a grid of voxels can be represented by a node in a tree data structure (e.g., octree). Each node can include the data associated with a corresponding voxel. For example, each node can be defined by encoding shape features, in sub-voxel feature decode module 112 in FIG. 1, using data types associated with a voxel that allow a shape feature to be decoded (e.g., extracted) from a given voxel and/or a group of voxels. As a result, the number of shape features can also be decoded from a given node in sub-voxel feature decode module 227 in FIG. 2. Decoding shape features from a particular node using associated data types can provide the ability to reconstruct shape features reaching resolution small than the size of voxel.

An octree can represent arbitrary shapes (e.g., convex, concave, and/or with holes) and can carry nodal attributes to represent any material distribution (e.g., material types and/or material properties). An octree can compress the voxel data structure by using the largest possible voxels to represent homogeneous regions. As used herein, a region is homogeneous when multiple neighboring nodes in the tree data structure (e.g., octree) have a uniformity of shape, material types, and/or material properties without boundaries associated with the shape of the 3-D object and/or boundaries associated with the material types and/or material properties that form the 3-D object intersecting the multiple neighboring nodes.

An additional light-weight post-processing procedure, that is referred to herein as octree clipping, can be implemented to further examine the tree to merge neighboring homogenous nodes into one. Significant file size reduction of a file used to store the tree data structure can be achieved by performing post-processing octree clipping. Furthermore, tree data structure serialization export 344 (e.g., deserialization) can be implemented to allow writing a tree data structure to a file for future use or for other applications. That is, an octree can be serialized and exported to provide a template of the 3-D object that can be referenced independently of the printing of the 3-D object on a particular 3-D printer. For example, an octree that is created to print a 3-D object on a first 3-D printer can be re-used to print the 3-D object on a second 3-D printer with a different printing resolution than the first 3-D printer without having to recreate the octree.

The tree data structure can be scaled 338 post-processing to meet the printing resolution of a particular 3-D printer. As used herein, post-processing refers to processing that occurs after the construction of the tree data structure 336. That is, the tree data structure can be scaled 338 independently of the construction of the tree data structure 336. Scaling 338 the tree data structure post-processing provides the ability to reuse a tree data structure to print a 3-D object on a plurality of 3-D printers with different printing resolutions without reconstructing the tree data structure multiple times.

In a number of examples, a scaling 338 of the tree data structure can be performed using a plurality of processors in parallel. A tree data structure with a particular resolution can be scaled to a higher resolution by examining and partitioning leaf nodes where deeper heterogeneity can be materialized while preserving the existing tree data structure.

Scaling a tree data structure to a higher resolution than that provided by the tree data structure can include decoding shape features from the individual voxels using associated data types associated with the individual voxels. The shape features can be decoded at a sub-voxel feature module 110 and/or a sub-voxel feature engine 225 in FIGS. 1 and 2, respectively.

A tree data structure with a particular resolution can also be scaled 338 to a lower resolution by examining and merging leaf nodes that may include similarities while preserving the existing tree data structure. For example, the solid nodes in a bottom layer of the tree data structure can be merged to scale 338 a tree data structure to a lower resolution.

Scaling 338 while preserving the existing tree data structure is referred to herein as graceful scaling because the tree data structure is not reconstructed but rather uses a previously existing tree data structure to further define (e.g., provide a higher resolution) the tree data structure.

Graceful scaling provides for efficient processing of the tree data structure. For example, a tree data structure can be computed and stored once with a default resolution using a shape specification 330 and material specification 332. A printing resolution and a number of materials allowed by a 3-D printer can be obtained to print a 3-D object using the tree data structure. The printing resolution and the number of materials can be compared to a default resolution of the tree data structure and the number of materials used in the tree data structure. Based on the comparison, the tree data structure can be scaled 338 to meet the resolution of a particular 3-D printer. In a number of examples, the tree data structure can be reevaluated to remove redundant nodes after the tree data structure is scaled 338.

The tree data structure can be sliced 340 to provide slice data to the 3-D printer. The tree data structure can be sliced 340 after the construction 336 of the tree data structure and/or the scaling 338 of the tree data structure. As used herein, slice data is a portion of the data inscribed in the tree data structure.

The tree data structure can be sliced 340 by implementing a top-down traversal of the tree data structure on a number of CPUs and/or GPUs and by associating neighboring nodes with each other. Neighboring nodes can be associated, for example, using node levels. That is, a tree hierarchy associated with the tree data structure can be defined. In a number of examples, the tree hierarchy associated with the tree data structure can be defined at a voxelization 334 of the shape specification 330 and/or the material specification 332, during a construction of the tree data structure 336, and/or during the scaling 338 of the tree data structure. Implementing a top-down traversal of the tree data structure and a grouping of nodes can accelerate the slicing 340 of the tree data structure.

Slicing 340 the tree data structure can include identifying a z-coordinate of a slice plane. The z-coordinate of the slice plane can be used to traverse the tree data structure to identify relevant nodes intercepted by the slice plane. The shape and material attributes associated with the relevant nodes can be collected to comprise the slice data. In a number of examples, the slice data can be further separated into a number of bitmaps per material types which can be transmitted to the printer to drive the printing of the 3-D object (e.g., drive the material deposition and object forming).

The slice plane can be independent of a voxel size and/or voxel resolution associated with the voxel representation (e.g., the grid of voxels). Independence between the voxel resolution and the slice plane can be created due to the data types stored in association with each of the voxels in the grid of voxels. For example, the data types can provide the ability to create a slice plane that can be used to provide shape features, via decoding from within the voxels without dividing a voxel into multiple voxels. The shape features can be reconstructed using surface triangles that are calculated using the data types (e.g., edge data, surface data, volumetric data, and/or nodal data).

When implementing plane cuts through this voxel, the resolution of the material change will not be limited at the voxel size (e.g., level), rather, the change in material can be defined within a voxel by intercepting this cutting plane with interception line, for example.

Figure 6:
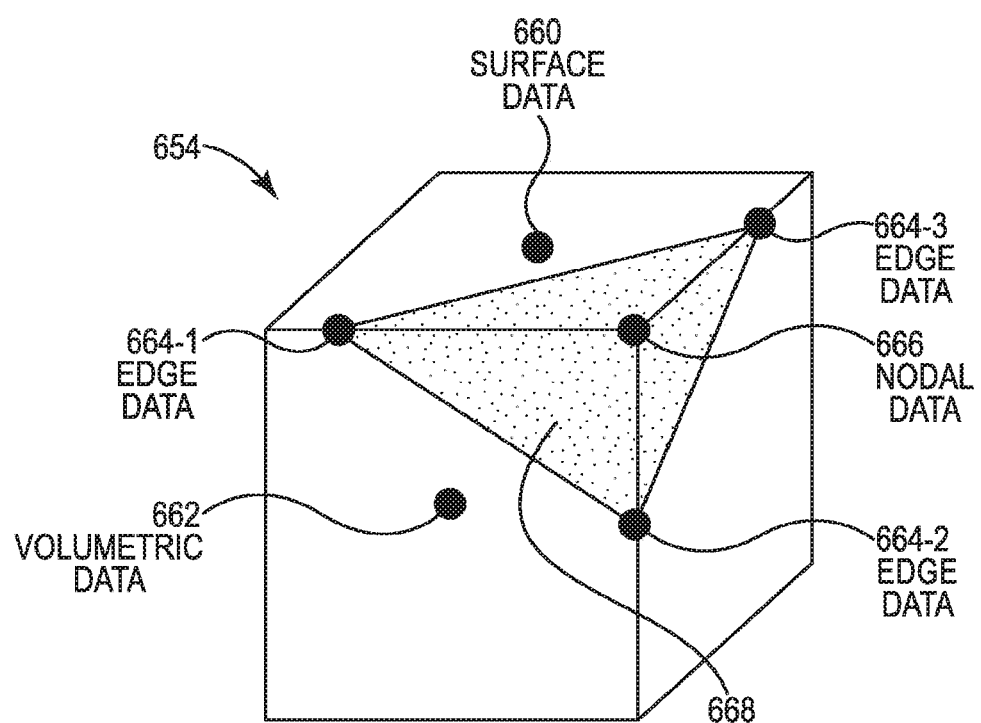
FIG. 6 illustrates an example of a voxel according to the present disclosure.

The surface triangles can define a cut boundary as described in FIG. 6. A cut boundary is a 3-D surface (e.g., flat or curved) that represents the intercept of the features of a 3-D object (e.g., shape boundary and/or material boundary) with a particular voxel. A cut boundary can be defined by a number of interception lines. The data types stored in voxels can be used to reconstruct surface triangles to define shape features in the form of cut boundaries. As used herein, a cut boundary can describe a plane that divides the volume of a voxel into at least two portions. However, the examples provided herein are not limited to re-constructing surface triangles. In a number of examples, other types of forms can be re-constructed. For example, re-constructing shape features can include other forms of cut boundary representation techniques such as functional representations, for example.

In a number of examples, shape features and/or material boundaries can be decoded from voxels using the associated data types before and/or during the slicing 340 of the tree data structure. The slice data can include the shape features (sub-voxel features) decoded from voxels using associated data types. As used herein, the terms shape features and sub-voxel features are used interchangeably.

Providing 346 the slice data to the printer can include progressively streaming the slice data to a 3-D printer to enable the printing of the 3-D object. Streaming the slice data can provide the ability to print large and complex 3-D objects without overburdening the printer networking and storage associated with the 3-D printer. Streaming the slice data can reduce the storage space used by the 3-D printer to receive the slice data because the slice data that is streamed to the 3-D printer does not describe the entire 3-D object at once but rather provides a portion of a description of the 3-D object at a given time.

The slicing of a tree data structures in a 3-D printer can be bounded by the CPU and memory installed in the 3-D printer. Uploading slice data to the 3-D printer will be bound by the storage space installed in the 3-D printer.

A computing device can slice the tree data structure using parallelized GPUs. The computing device can also stream the slice data to the 3-D printer. Streaming the slice data to the 3-D printer can include streaming a single slice or a plurality of slices at a given time. The rate of slices from the slice data streamed to the 3-D printer can be associated with the storage space available to the 3-D printer and the time to print a layer a layer using the 3-D printer. For example, a second slice of data can be provided to the 3-D printer after the 3-D printer prints a portion of the 3-D object associated with the slice of data when a first slice of slice data can be provided to the 3-D printer.

In a number of examples, the slice data can be continuously streamed to the printer until a total unprinted slice count stored at the 3-D printer is equal to a particular number of slices (e.g., a user set number bound by storage limitation in printer). In a number of examples, the slice data that has been printed is discarded.

A first-in-first-out queue can be used to store streamed slices in the 3-D printer. The queue length (N) can be bound by the storage space in the 3-D printer. A 3-D printer can pull a slice of the slice data (e.g., current slice) from the head of a queue, print the pulled slice, and/or discard the printed slice. The 3-D printer can request additional slice data from a slice engine when there is an empty cell in the queue. The slice engine can process an additional slice and provide the additional slice to the 3-D printer.

FIG. 4 illustrates a block diagram of an example of creating a voxel representation of a 3-D object according to the present disclosure. As shown at 472 a number of inputs are obtained. The inputs can include a shape specification, a material specification (not shown), a number of material types, 3-D object criteria, constraints, and/or 3-D object objectives. However, more or less inputs than those shown herein can be used to create a voxel representation of the 3-D object.

In FIG. 4, the material types obtain at 472 can be different than the material types provided in a material specification. That is, the material types provided by a user via a material specification can be different than the material types provided by a 3-D printer. For example, the material types presented in a material specification (e.g., by a user) can describe ideal material used to create a 3-D object. Material types obtained at 472 can describe materials that are available to a particular 3-D printer for printing the 3-D object using a voxel representation of the 3-D object.

In a number of examples, the material types obtained at 472 can be ranked based on their immediate availability to a printer that prints the 3-D printer. The material types obtained at 472 can also be ranked based on their cost which will affect the cost of printing the 3-D object. The material types obtained at 472 can also be ranked based on other factors. The initial assignment of material types to voxels can be based on the ranking of the material types. Subsequent assignments of the material types to voxels can also be based on the ranking of the material types.

The material types obtained at 472 can affect the resulting performance of the 3-D object and/or a part associated with the 3-D object. A VOID value can be a material type that identifies that a voxel is intentionally left empty.

A performance of the 3-D object and/or a part associated with the 3-D object can describe a performance of engineering properties and/or fabrication properties. 3-D object criteria can be hard engineering properties that the 3-D object and/or parts associated with the 3-D object meet. For example, a 3-D object requirement can define a stiffness and/or a translucency associated with the 3-D object and/or a part of the 3-D object. Other 3-D object criteria can define different attributes of the 3-D object.

3-D object objectives can be measurements associated with the performance of engineering properties of the 3-D object and/or parts of the 3-D object. 3-D object objectives can also be measurements associated with the performance of fabrication properties of the 3-D object. As used herein, the performance of engineering properties describe a function of the 3-D object and/or a property of the 3-D object that impacts the performance of the 3-D object. The performance of a fabrication property describes a fabrication of the 3-D object and/or a part associated with the 3-D object. For example, a fabrication property can include a cost associated with the printing of the 3-D object and/or a part associated with the 3-D object, a time duration associated with the printing of the 3-D object and/or the part associated with the 3-D object, a type of printer desired to print the 3-D object and/or the part associated with the 3-D object, among other fabrication properties.

As shown at 473, a voxel representation of the 3-D object can be created as described in FIG. 3. Creating a voxel representation of the 3-D object can further include classifying the voxels in the voxel representation as exterior voxels, surface voxels, and/or interior voxels, or shell voxels, among other classifications of voxels.

An exterior voxel can identify portions of the voxel representation of the 3-D object that are not part of the 3-D object. That is, an exterior voxel can identify negative space which a 3-D printer does not print.

The creation of the voxel representation of the 3-D object can include dividing the 3-D object into surface voxels and/or interior voxels. In a number of examples, the shape specification and/or the material specification can identify a surface portion of the 3-D object and/or an interior portion of the 3-D object. In such examples, surface voxels can be created from the surface portion identified in the shape specification and/or the material specification. The interior voxels can be created from the interior portion identified in the shape specification and/or the material specification.

In a number of examples, the shape specification and/or the material specification does not identify a surface portion of the 3-D object and/or an interior portion of the 3-D object. In such examples, a 3-D object can be divided into a surface portion and/or an interior portion of the 3-D object. The surface voxels and/or shell voxels can represent the surface portion of the 3-D object. The interior voxels can represent the interior portion of the 3-D object. Dividing a 3-D object into a surface portion and/or an interior portion of the 3-D object serve a number of purposes. Dividing a 3-D object into a surface portion and/or an interior portion can provide flexibility in meeting the number of 3-D object objectives and/or the number of 3-D criteria. For example, dividing the 3-D object into a surface portion and/or an interior portion can provide the ability to meet a weight objective and/or requirement of the 3-D object.

Surface voxels (e.g., shell voxels) can include the voxels that the shape surface cuts through. The surface voxels can also include voxels that are exposed to a shape boundary of the 3-D object. A surface voxel can be exposed to the shape boundary of the 3-D object when a surface of a voxel, an edge of a voxel, and/or a corner of a voxel is exposed to the shape boundary.

Shell voxels can include both surface voxels and interior voxels that are close to the surface voxels. For example, shell voxels can be additional voxels next to the surface voxels that may be treated as surface voxels depending on the adjacency criterion. An adjacency criterion can be defined by a number of voxels that comprise a depth of the shape surface. For example, a depth of the shape surface can be comprised of 6-adjacent voxels, 18-adjacent voxels, and/or 26-adjacent voxels, among other possible depths. Voxels can be classified as shell voxels instead of surface voxels to define surface properties. For example, a color and/or a texture that define a material type that is associated with shell voxels can retail the material type properties through a number of adjacent voxels while a color and/or texture that define a material type of surface voxels dues not affect voxels that are adjacent to the surface voxels. In a number of examples, the surface voxels and/or the shell voxels cannot be assigned a VOID material type.

In a number of examples, a different representation other than the voxels representation of the 3-D object can be comprised of a different basic unit used to represent the 3-D object. For example, a nodal representation (e.g., octree) of the 3-D object can include a surface portion comprised of nodes.

Dividing surface voxels from interior voxels can provide the ability to meet 3-D object objectives and/or 3-D criteria associated with a surface of the 3-D object. For example, separating surface voxels from interior voxels can provide the ability to assign different material types to the surface voxels as compared to the interior voxels. The different material types can provide different properties to the surface voxels and/or the interior voxels. For example, a color and/or texture associated with the surface of the 3-D object can be represented in the surface voxels by assigning different material types to the surface voxels as compared to the interior voxels.

The surface voxels should not be filled with VOID material type to preserve the shape of the 3-D object. In a number of examples, additional limitations may be placed on the surface voxels. For instance, the assignment of a material type to the surface voxels may be limited by the assignment of a material type to the interior voxels, the 3-D object objectives, and/or the 3-D criteria.

Interior voxels can be assigned a VOID material type and/or any other material type available to a particular 3-D printer for printing. The choice of the selection of a material type of interior voxels can be guided by the 3-D object objectives and/or the 3-D criteria.

As shown at 474, a material type can be assigned to each voxel such that every voxel is assigned a material type. The assignment can be to a voxel and/or a fraction of voxel. Assigning a material type to a fraction of a voxel can include assigning a first material type to a first portion of a voxel and a second material type to a second portion of the voxel.

The material types assigned to fractions of a voxel can be influenced by particular printing processes. A solidification process of particular technology can describe different translations (e.g., compensation) between the material types assigned to fractions of a voxel and the bitmaps that pattern the solidification agents (e.g., inkjet droplets in the case of multi-jet fusion, laser beams in the case of SLS). Such translations that modify the material types assigned to portions of voxels can result in different choices of the solidification processes. The different choices can include material types, solidification agents, half-toning (e.g., dot patterns), and/or limits to agents' coverage, among other choices of the solidification process.

Different materials go through different printing processes. The different printing processes can have different physical distortions. For instance, a first printing process can cause shrinkage of the material types used. A second printing process can cause expansion of the material types used. Such physical distortion may vary differently between material types, and/or printing processes. To compensate for the physical distortion of the printing processes, the voxel representation of the 3-D object can be pre-expanded or/and pre-shrunk. For example, different portion of the voxel representation can be pre-expanded and/or pre-shrunk so that the final fabricated product will have the correct shape.

The assignment of a material type to a voxel and/or a fraction of a voxel can be random, guided by the material specification, and/or guided by a learning module as described below. A random number generator can be used to choose a material type for a voxel (e.g., a surface voxel and/or an interior voxel). For instance, a floating point f between [0,1] can be generated by a random number generator. A material type can be selected by multiplying N with f (e.g., f*N) and rounding the result of the nearest integer, where N is the total number of material types and each integer between [0,N] represents a different material type identification (ID). For example, if a random number generator produces a floating point with a 0.3 value and there are ten different material types, then a selected material type can be a material type with a material type ID equal to three (3) which is the result of 0.3 multiplied by 10.

The assignment of the material types at 474 can be guided by the material types defined in a material specification. The material types obtained at 472 can be correlated with the material types defined in the material specification. The material types can be assigned to voxels based on the correlation between material type obtained at 472 and the material types defined in the material specification. For example, a voxel associated with the volume can be assigned the second material type when a particular volume in material specification is associated with a first material type defined by the material specification and the first material type is correlated to a second material type obtained at 472. Once all of the voxels in a voxel representation of the 3-D object have been assigned a material type, then the voxel representation of the 3-D object can be complete.

As shown at 475, a 3-D object (e.g., the 3-D object described in the voxel representation) can be evaluated. Evaluating the 3-D object can include evaluating a performance of the 3-D object. A performance associated with the 3-D object can include a performance of engineering properties of the 3-D object and/or a performance of fabrication properties of the 3-D object. The performance of the 3-D can meet the 3-D object objectives and/or the 3-D criteria. The engineering properties can include volumetric properties such as stiffness or surface properties such as texture and/or color among other volumetric properties. Fabrication properties can include both time and/or material costs and may include other attributes such as a determining whether the 3-D object can be batch fabricated with other parts.

The 3-D object can be evaluated based on a simulation of the production of the 3-D object and/or on the physical fabrication of the 3-D object. The 3-D object can also be evaluated based on a simulation of the production of a number of parts of the 3-D object and/or on the physical fabrication of the number of parts of the 3-D object.

A simulation of the 3-D object and/or the parts of the 3-D object can be performed via a simulation module and/or a simulation engine that is part of a computing device executing the instructions defined in FIG. 4 and/or a third party simulation module and/or a simulation engine. For example, a simulation can be performed via a finite element method (FEA) multi-physics simulation and/or a color/texture appearance simulation, among other types of simulations that can be performed.

Evaluating the 3-D object can also include fabricating the 3-D object and physical evaluating the 3-D object and/or parts associated with the 3-D object to experimentally measure the functionality of the 3-D object. Printing the 3-D object can include slicing the voxel representation of the 3-D object as described in FIG. 3. The evaluation of the 3-D object can determine whether the 3-D object objectives and/or the 3-D criteria are met. The quantitative evaluations of the 3-D objectives and/or the 3-D criteria can be compared to the 3-D objectives and/or the 3-D criteria provided in 472 to evaluate the quality of the material assignment (e.g., the assignment of material types to voxels). Regardless of the method of evaluation, a quantitative evaluation of the 3-D object can be reached.

As shown at 476, it can be determined whether a termination condition is met. A termination condition can be defined as meeting all 3-D object objectives and/or all 3-D criteria. A different termination condition can determine whether the performance of the 3-D object is converging towards meeting the 3-D object objectives and/or the 3-D criteria as compared to previous iterations (e.g., generation) of the assigning of material types at 474 and 477. That is, it can be determined whether the performance of the 3-D object is converging towards an optimal meeting of the 3-D object objectives and/or the 3-D criteria. Other termination conditions can be used to determine whether the material types should be re-assigned and/or whether to continue to 478.

In a number of examples, a termination condition can be triggered based on a result of external services. For example, a 3-D printer can be ready for the printing of the 3-D object after the printing of different 3-D objects. To efficiently utilize a number of external services, the termination service can be triggered.

As shown at 477, a material type can be re-assigned to the voxels of the voxel representation of the 3-D object when a termination condition determines at 476 that material types should be re-assigned. That is, material types can be re-assigned to voxels when a termination condition is not met at 476.

In a number of examples, some but not all portions of the voxels of the voxel representation of the 3-D object can be re-assigned a material type. For example, a material type can be re-assigned to voxels of second part while a material type of the voxels of the first part are not re-assigned when a first part of the 3-D object meets a number of 3-D object objectives but a second part of the 3-D object does not meet the number of 3-D object objectives.

The re-assignment of the material types to voxels can learn from previous assignments and the performance evaluations of the 3-D object. For instance, the re-assignment can be driven by the evolutionary operations (e.g., mutation, crossover, and/or elitism, among others) of the learning module. The re-assignment of the material types can also enhance the performance evaluation of the 3-D object.

The re-assignment of the material types can be based on a learning algorithm. An example of a learning algorithm can include a genetic learning module, among other types of learning algorithms. Using a genetic learning module to assign material types, the assignment and/or the re-assignment of material types to voxels can be generations of assignments. A number of evolutionary operations can be to correctly select and assign material types to voxels. A number of evolutionary operations can include mutations, breeding, and/or elitism, among other evolutionary operations. An evolutionary operation can describe how the different generations of assignment of material types are combined to create a new generation. For example, a mutation evolutionary can take a last generation of assignment of material types to voxels and change random assignments of material types to voxels to a new assignment of material types to voxels. A breeding evolutionary operation can take two or more generations of assignments of material types to voxels and take assignments of material types to groups of voxels from each of the generations to create a new assignment of material types to voxels. In a number of examples, a number of generations of assignments can be created in parallel using a parallelized implementation of the genetic learning module using a plurality of computing resources.

As shown at 478, the data creation of the voxel representation of a 3-D object with assigned material types can terminate by writing the data structure to a tree structure such as an octree. The voxel representation can also be stored in memory for later use by tree structure construction 336 in FIG. 3. The voxel representation can also be provided for scaling at 338 in FIG. 3 and for printing, after slicing, to a printing device.

FIG. 5 illustrates an example of a grid of voxels according to the present disclosure. FIG. 5 illustrates a 3-D object 550 and a grid of voxels 552. The grid of voxels 552 can be a voxel representation of the 3-D object.

As illustrated in FIG. 5, each voxel is represented by a cube. However, other shapes can be used to represent a voxel. Each of the plurality of voxels can have different dimensions. For example, a first voxel from the grid of voxels 552 can define a first volume while a second voxel from the grid of voxels 552 can define a second volume. A resolution associated with the grid of voxels 552 and/or a tree data structure that corresponds to the grid of voxels 552 can be defined by a smallest voxel from the grid of voxels 552. A smallest voxel can be defined in terms of volume, area, material type and/or material property discretization, and/or any other standard provided for comparing voxels.

In FIG. 5, the volume associated with a given voxel can decrease to accommodate the shape of the 3-D object 550. For example, a first shape associated with the 3-D object 550 may be represented using a first number of voxels wherein each of the first number of voxels has a first volume. A second shape associated with the 3-D object 550 that is less intricate than the first shape may be represented in a second number of voxels wherein each of the second number of voxels has a second volume that is greater than the first volume.

FIG. 6 illustrates an example of a voxel according to the present disclosure. FIG. 6 shows a voxel 654 having a plurality of data types. The data types include a surface data 660, a volumetric data 662, edge data 664-1, 664-2, 664-3 (e.g., referred to herein as edge data 664), and nodal data 666. More or less data types than those shown in FIG. 6 can be used.

FIG. 6 also illustrates a cut boundary 668 interception with voxel 652 resulting in a triangular cut. This cut boundary 668 may be part of shape specification or part of the material specification to describe a boundary between two different materials and/or material properties).

Volumetric data 662 can describe a volumetric fractional percentage of a material. The volumetric data can be associated with a voxel center. The volumetric fractional percentage is calculated after computing a cut boundary 668 which separates a voxel's volume into at least two portions. The cut boundary 668 can be calculated using a number of interception lines (e.g., triangular intercepting lines). A surface normal is usually associated with the cut boundary 668 which indicates which side of the cutting boundary is which material or, in terms of describing geometry, which side is inside (e.g., solid) a 3-D object and which side is outside (e.g., VOID) the 3-D object. The surface normal allows the computation of the volumetric fractional percentage by informing which side of the cutting triangle is solid. The information provided by the surface normal and the volumetric fractional percentage (e.g., which side is solid, which side is VOID) is in turn recorded as nodal data. For instance, the node data 666 can be marked differently from nodal data associated with the other seven corners of the voxel 654.

For example, node data 666 can be marked as VOID to label the tetrahedron volume defined by node 666 and a cut boundary 668, which is defined by the three interception lines linking edge data 664-1, 664-2, and 664-3, as being devoid of a material type and/or material property. The nodal data associated with the other 7 corners of the voxel 654 can be marked as solid to label the remaining volume in voxel 654 as being formed by a material type and/or a material property. The cut boundary 668 is defined by the triangular intercepting lines linking edge data 664-1, 664-2, and 664-3.

Surface data 660 can describe an area fractional percentage of a material. The surface data may be associated with the center of a surface that forms a voxel. The surface fraction can be recorded as a surface value. For example, the top surface can be partitioned into two parts by an interception line connecting edge data 664-1 and 664-3. The surface fraction for this surface records the percentage of the top surface that is occupied (e.g., solid).

Edge data 664 can indicate the intersection points. Connecting interception points form an intercepting line. In FIG. 6 the interception line is a straight line but can also be curved. Closed segments of intercepting lines can define a cut boundary 668 that cuts through voxel 654. In FIG. 6, a cut boundary 668 is represented by the lines connecting edge data (e.g., interception points) 664-1, 664-2, and 664-3. A cut boundary 668 can represent the boundary of a material. The cut boundary 668 can cut (e.g., intersect) a voxel when the cut boundary 668 lies within the volume described by the voxel 654. The edge data 664 can describe the intersection of the cut boundary 668 and the voxel without dividing the voxel 654 into a plurality of voxels to provide a higher resolution of the volume described by voxel 654. Nodal data 666 can provide an ID of a number of materials that are associated with the voxel 654.

Each of the data types (e.g., surface data 660, volumetric data 662, edge data 664, and nodal data 666) can be a single floating point or may be a plurality of floating points. For example, a volumetric data 662 can include a plurality of floating points that describe the division of the voxel 654. For example, the volumetric data can include a 0.7 floating point and a 0.3 floating point that describes the bifurcation of the volume described by voxel 654. For example, a cut boundary 668 defined by edge data 664 can have a volumetric fractional percentage of 0.3 while the other portion of voxel 654 can have a volumetric fractional percentage of 0.7.

The shape and material associated with a voxel 654 can further be captured by adding a material type VOID that fills in all the space outside of the solids defined by shape specification. A VOID material type provides the ability to unify the shape specification and the material specification.

To describe a single-material part, volumetric data 662 can be a single floating point recording the volumetric percentage of this material that fills voxel 654. The VOID percentage occupation can be easily computed as the whole is one. To describe an N-material part, a volumetric fraction can be a plurality of floating points of size N. The surface data 660 and the edge data 664 can be similarly defined.

The data types can be used to describe a shape and material distributions. Additional data types not shown herein can be used to describe material properties associated with a voxel 654. For instance, color and texture can be surface data associated with a surface. Thermal expansion coefficient and Young's modulus are bulk material properties that can be are volumetric data 662 associated with the voxel's 654 volume.

The voxelization 334 in FIG. 3 of the shape specification and the material specification can be directly applied to fill in these data types when processing both the shape and material specifications. For example, while analyzing a surface triangle associated with a shape specification, the edge data 664 can be computed and stored. During the voxelization process the nodal data 666, surface data 660, and/or volumetric data 662 can be computed and associated with node 654. In a number of examples, the data types can be associated with a given voxel 654 during the construction of the tree data structure 336, the scaling 338, and/or the slicing 340 of a tree data structure as described in FIG. 3.

The neighboring voxels can be combined into a larger leaf node in the tree data structure (e.g., octree) when all neighboring voxels are similar (e.g., having similar data types and similar values for the corresponding data types). In other words, the clipping of a tree data structure is applicable for this data structure.

Figure 7:
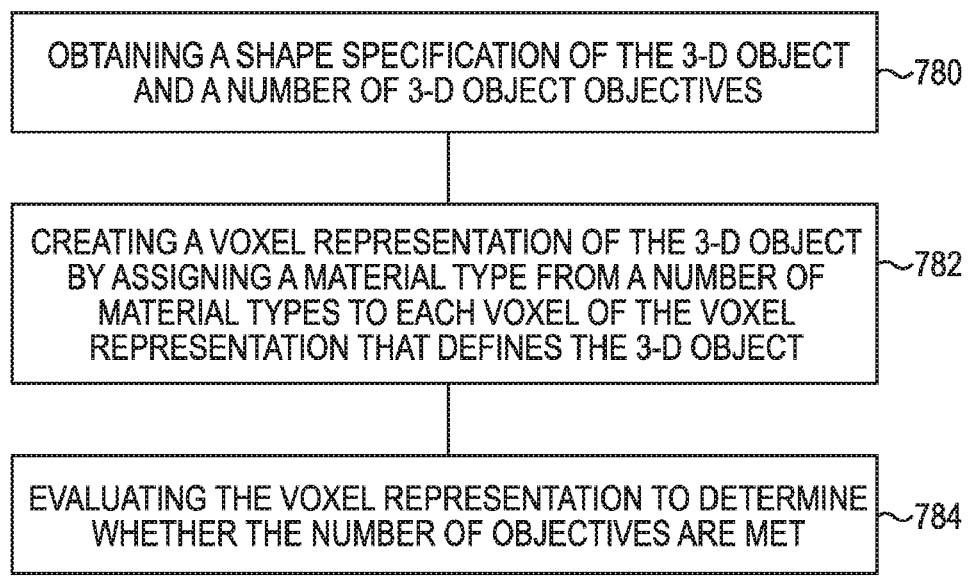
FIG. 7 illustrates a flow diagram of an example of a method for creating a voxel representation of a 3-D object according to the present disclosure.

FIG. 7 illustrates a flow diagram of an example of a method for creating a voxel representation of a 3-D object according to the present disclosure. As shown at 780, a shape specification of a 3-D object and a number of objectives for the 3-D object can be obtained. A number of material specifications of a 3-D object and/or a number of material types can also be obtained.

As shown at 782, a voxel representation of the 3-D object can be created by assigning a material type from a number of material types for each voxel of the voxel representation that defines the 3-D object. The material types can be obtained from a 3-D printer and can define a number of materials used by the 3-D printer to print the 3-D object. Obtaining and assigning material types that are associated with 3-D printers to voxels can provide flexibility in customizing and printing a 3-D object was is created using a general shape specification and/or a material specification. Assigning material types to voxels to meet 3-D object objectives and/or 3-D criteria can also provide the ability to guide the performance of the 3-D object. As shown at 784, the voxel representation can be evaluated to determine whether the number of objectives are met.

In the present disclosure, reference is made to the accompanying drawings that form a part hereof, and in which is shown by way of illustration how a number of examples of the disclosure can be practiced. These examples are described in sufficient detail to enable those of ordinary skill in the art to practice the examples of this disclosure, and it is to be understood that other examples can be used and that process, electrical, and/or structural changes can be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. The proportion and the relative scale of the elements provided in the figures are intended to illustrate the examples of the present disclosure, and should not be taken in a limiting sense.

The specification examples provide a description of the applications and use of the system and method of the present disclosure. Since many examples can be made without departing from the spirit and scope of the system and method of the present disclosure, this specification sets forth some of the many possible example configurations and implementations.

As used herein, "a" or "a number of" something can refer to one or more such things. For example, "a number of widgets" can refer to one or more widgets.

What is claimed:

1. A method for printing a three-dimensional (3-D) object comprising:
    creating a voxel representation of a 3-D object to be printed;
    assigning a material type from a number of material types to a fraction of at least one voxel of the voxel representation, wherein a boundary between adjacent material types is defined by a cut boundary intersection of a shape specification with the at least one voxel; and
    printing the 3-D object based on the voxel representation and assigned material types.

2. The method of claim 1, wherein material types assigned to a voxel is based on a desired objective for the at least one voxel.

3. The method of claim 2, wherein the desired objective is selected from the group consisting of:
    an elasticity objective;
    a mechanical strength objective;
    a temperature objective; and
    a weight objective.

4. The method of claim 2, further comprising, evaluating the voxel representation, each time a material type is assigned to a voxel, to determine whether the desired objective is met.

5. The method of claim 4, further comprising re-assigning, based on a learning module, the material type when the desired objective is not met.

6. The method of claim 1, further comprising assigning additional data types to the at least one voxel of the voxel representation.

7. The method of claim 1, wherein assigning a material type is based on a solidification operation for the 3-D object.

8. The method of claim 7, wherein assigning a material type based on a solidification operation comprises adjusting, based on the solidification operation, at least one of:
    a building material;
    a solidification agent;
    a half-toning operation; and
    a coverage of the solidification agent.

9. The method of claim 1, further comprising adjusting a size of the voxel representation based on the printing process.

10. The method of claim 1, wherein creating a voxel representation of a 3-D object to be printed comprises creating voxels of different sizes in the voxel representation.

11. The method for printing a three-dimensional (3-D) object of claim 1, wherein:
    a grid of voxels;
    a material type assigned to a fraction of at least one voxel of the voxel representation; and
    a number of additional data types assigned to the at least one voxel;
    the method further comprising:
        decoding a number of features of the 3-D object from the material types and additional data types of the voxel representation, wherein the number of features comprises shape features and material boundaries associated with the 3-D object to be printed; and printing the 3-D object based on the decoded features of the 3-D object at a higher resolution than provided by the grid of voxels.

12. The method of claim 11, wherein the additional data types are selected from the group consisting of:
surface data;
volumetric data;
edge data; and
nodal data.

13. The method of claim 1, further comprising:
representing each voxel as a node in a tree data structure, wherein a node comprises material type, material property, constraints, and objectives for an associated voxel; and
merging neighboring homogenous nodes.

14. A non-transitory machine-readable storage medium storing instructions for printing a three-dimensional (3-D) object, the instructions executable by a machine to cause the machine to:
receive a material specification for a 3-D object to be printed, wherein the material specification identifies a material type selected by a user regarding the 3-D object to be printed and a material property of the material type;
determine printing material available at a 3-D printer;
convert the material type selected by the user into a printing material type available at the 3-D printer;
create a voxel representation of the 3-D object to be printed;
assign a printing material used by the 3-D printer to print a 3-D object to a fraction of at least one voxel of the voxel representation based on the material specification and the printing material available at the 3-D printer to define features of the 3-D object at a higher resolution than the 3-D printer, wherein a boundary between adjacent printing materials is defined by a cut boundary intersection of a shape specification with the at least one voxel; and
print the 3-D object based on the voxel representation and assigned printing materials.

15. The non-transitory machine-readable storage medium of claim 14, wherein the printing material is selected from the group consisting of:
a build material;
a detailing agent;
a solidification agent; and
a coalescence modifier.

16. The non-transitory machine-readable storage medium of claim 14, wherein assigning a printing material is selected based on a printing process for the 3-D object to be printed.

17. The non-transitory machine-readable storage medium of claim 14, wherein creating a voxel representation of the 3-D object to be printed comprises merging at least one shape specification for the 3-D object to be printed and at least one material specification for the 3-D object to be printed.

18. The non-transitory machine-readable storage medium of claim 17, wherein merging at least one shape specification for the 3-D object to be printed and at least one material specification for the 3-D object to be printed comprises merging multiple shape specifications for the 3-D object to be printed and one material specification for the 3-D object to be printed.

19. The non-transitory machine-readable storage medium of claim 17, wherein merging at least one shape specification for the 3-D object to be printed and at least one material specification for the 3-D object to be printed comprises merging one shape specifications for the 3-D object to be printed and multiple material specifications for the 3-D object to be printed.

20. The non-transitory machine-readable storage medium of claim 17, further comprising geometrically scaling the at least one shape specification for the 3-D object to be printed and the at least one material specification for the 3-D object to be printed.

* * * * *